US006671049B1

(12) United States Patent
Silver

(10) Patent No.: US 6,671,049 B1
(45) Date of Patent: Dec. 30, 2003

(54) ARTICLE OF MANUFACTURE BEARING A UNIVERSAL ALIGNMENT TARGET

(75) Inventor: William Silver, Weston, MA (US)

(73) Assignee: Cognex Corporation, Natick, MA (US)

( * ) Notice: Subject to any disclaimer, the term of this patent is extended or adjusted under 35 U.S.C. 154(b) by 408 days.

(21) Appl. No.: 09/699,540

(22) Filed: Oct. 30, 2000

Related U.S. Application Data

(60) Provisional application No. 60/162,521, filed on Oct. 29, 1999.

(51) Int. Cl.$^7$ ............................................. G01B 11/00
(52) U.S. Cl. ....................... 356/401; 356/400; 356/399
(58) Field of Search ................................ 356/399, 400, 356/401; 382/103, 151, 294; 702/150

(56) References Cited

U.S. PATENT DOCUMENTS

| | | | | |
|---|---|---|---|---|
| 5,835,227 A | * | 11/1998 | Grodnensky et al. | ........ 356/399 |
| 5,960,125 A | | 9/1999 | Michael et al. | |
| 5,974,365 A | | 10/1999 | Mitchell | |
| 6,074,950 A | * | 6/2000 | Wei | ............................. 438/692 |
| 6,137,893 A | | 10/2000 | Michael et al. | |

FOREIGN PATENT DOCUMENTS

| | | |
|---|---|---|
| JP | 05-025989 | 5/1994 |
| WO | PCT/US 97/18268 | 4/1998 |

OTHER PUBLICATIONS

David I. Haverlock, Geometric Precision in Noise–Free Digital Images, IEEE Transactions on Pattern Analysis and Machine Intelligence, vol. II No. 10. Oct. 1989.

John W. Hill, Machine Intelligence Research Applied To Industrial Automation, National Technical Information Service, U.S. Department of Commerce, Nov. 1980.

Chinmoy B. Bose and Isreal Amir, Design of Fiducials for accrate Registration Using Machine Visions, IEEE Transaction on Pattern Analysis and Machine Intelligence, vol. 12 No. 12, Dec. 1990.

Lawrence O'Gorman, Subpixel Precision of Straight–Edged Shapes for Registration and Measurment, IEEE Transactions on Pattern Analysis and Machine Intelligence, vol. 18, No. 7 1996.

H.F. Gillespie and J.E. Martin, Optimization of Optical Alignment Marks Through Circuit Design Rule Consideration, Rockwell International, Newport Beach, CA, 1978.

Neal T. Sullivan, Semiconductor Pattern Overlay, Digital Equipment Corp., Advanced Semiconductor Development.

Hideki Ina, Koichi Sentoku and Takahiro Matsumoto (Nano-technology research Center)—Hiroaki Sumitani and Muneyoshi Suita (Advanced Technology R&D Center, Alignment Mark Optimization to Reduce Tool and Wafer Induced Shift for XRA–1000.

W. Makous, Optimal Patterns For Alignment, Applied Optics vol. 13, No. 3, Mar. 1974.

Egil D. Castel and Nader Shamma, Design and Optimization of Site–By–Site Alignment Marks for a Single Polysilicon Bipolar Process, National Semiconductor Corporation, Elsevier Science Publishers B.V.

Alfred M. Bruckstein, Larry O'Gorman and Alon Orlitsky, Design of Shapes for Precise Image Registration, IEEE Transactions on Information Theory, vol. 44, No. 7, Nov. 1998.

* cited by examiner

Primary Examiner—Rodney Fuller
(74) Attorney, Agent, or Firm—Russ Weinzimmer

(57) ABSTRACT

An article of manufacture bearing an alignment target having at least one of the following attributes: it has no significant rotational symmetry; it has no significant orientation self-similarity or size self-similarity; it is not primarily composed of circles, circular arcs, straight lines, or right angles; and it may have other unique attributes. In one embodiment, the specific alignment targets are shapes consisting of at least one "generalized polar polygon." Such a figure will include radial lines, circular arcs, and spiral segments when drawn in the Cartesian plane. In another embodiment, the specific alignment targets are members of a family of "fan" shapes.

17 Claims, 8 Drawing Sheets

ARTICLE OF MANUFACTURE BEARING A UNIVERSAL ALIGNMENT TARGET

RELATED APPLICATION DATA

This application claims priority to U.S. Provisional Patent Application No. 60/162,521, filed in the U.S. Patent and Trademark Office on Oct. 29, 1999, the content of which is hereby expressly incorporated by reference herein in its entirety.

COPYRIGHT NOTICE

The disclosure of this patent document contains material that is subject to copyright protection. The copyright owner has no objection to the facsimile reproduction by anyone of the patent document or the patent disclosure, as it appears in the United States Patent and Trademark Office patent file or records, once a patent is issued on this application, but otherwise reserves all copyright rights whatsoever.

FIELD OF THE INVENTION

This invention relates to automated visual alignment, and particularly to articles of manufacture bearing an alignment target adapted to facilitate automated visual alignment.

BACKGROUND OF THE INVENTION

The ability to determine the position and/or attitude of an object is of considerable practical importance in many applications, including industrial manufacturing, robot guidance, intelligent transportation systems, mail and parcel handling, and many others. Position might include up to three degrees of freedom (e.g., up-down, in-out, and side-ways), and the three degrees of freedom of attitude (e.g., pitch, yaw, and roll). Together these six degrees of freedom can be used to describe what can be referred to as the "location" or "pose" of an object. Note that here, "location" or "pose" can mean more than just position in three spatial dimensions—it can also include information as to the other non-translational degrees of freedom, such as skew, perspective, aspect-ratio, and many other more exotic non-translational degrees of freedom. In a two-dimensional plane, position includes two translation degrees of freedom (e.g., up-down and side-ways), and at least one non-translation degree of freedom, such as "orientation" (a rotation degree of freedom), and possibly skew, aspect ratio, size, and others.

It is well-known to use machine vision to locate objects at a distance. A digital image of a scene containing an object to be located is formed by any suitable apparatus, for example consisting of visible light illumination, a CCD camera, and a video digitizer. The digital image is then analyzed by a suitable image analysis device, for example consisting of a digital signal processor or personal computer running software that implements a suitable method for identifying and locating image patterns that correspond to the object of interest. The analysis results in certain parameters that describe the pattern in the image that corresponds to the object, or a suitable portion of the object, in the scene. These parameters might include position, attitude, and size of the pattern in the image. These parameters are then used to compute the location (pose) of the object using well-known mathematical formulas.

There are many methods known in the art for analyzing digital images to determine one or more of the pattern parameters, including blob analysis, normalized correlation, Hough transforms, and geometric pattern matching. Numerous other methods have been used or proposed in commercial practice or in academic literature.

The process of determining object location (pose) by machine vision can be referred to in various ways, including "alignment", "registration", "pattern recognition", and "pattern matching". For present purposes herein, those terms are equivalent, and so herein the term "alignment" shall be used to refer to any such process. Any object, or portion of an object, that gives rise to the pattern in the image to be analyzed shall be called an "alignment target", or simply a "target".

Most machine vision alignment applications require locating targets having a shape determined by engineering considerations that are largely independent of the needs of automated visual alignment. In these cases, the objects contain no special markings or components specially adapted to aid the alignment method. Consequently, the alignment method must work with whatever object shape is given. There are many applications, however, where the alignment target can be engineered specifically for that purpose. Examples include fiducial marks on printed circuit boards, registration marks etched on silicon wafers, and "bull's eye" targets used by the United Parcel Service on package labels. A target that has been engineered to aid machine vision alignment can be called a "cooperative target." In contexts where it is clear that a target has been engineered for alignment, the modifier "cooperative" is sometimes omitted, but "cooperative" is understood.

Although alignment methods have an extensive literature and commercial history, relatively little work has been done on understanding the effect of target shape on alignment performance. The work is almost entirely restricted to shapes composed of circles and polygons, to the effect of such shapes on binary image analysis methods, to translation-only (i.e., horizontal and vertical) alignment, and to accuracy criteria only.

Rotationally symmetric targets, primarily circles and "bull's-eye" patterns, have long been a favorite in the academic literature. In a 1974 paper, for example, W. Makous "Optimal Patterns for Alignment", in Applied Optics, Vol. 13, No. 3, states that "a bull's-eye pattern of regularly alternating black and white rings would be optimal for visual alignment in two dimensions." Twenty four years later, in a 1998 paper entitled "Design of Shapes for Precise Image Registration", in IEEE Trans. on Information Theory, Vol. 44:, No. 7, Bruckstein, O'Gorman, and Orlitsky state that "Experimental tests and . . . theoretical developments . . . led to the conclusion that the 'bull's-eye' fiducial is indeed a very good, robust and practical location mark."

Rotationally symmetric targets suffer from a number of limitations, however, that have not been anticipated in the prior art. First, such targets contain no information for measuring orientation. This has been considered an advantage, based on the assumption that alignment methods would fail under orientation misalignment unless the target is rotationally symmetric, but the recent advent of practical methods for orientation alignment have created a need for targets that convey substantial orientation information.

A second limitation of rotationally symmetric targets, such as the "bull's eye" pattern, is that circles and arcs of circles are extremely common in manufactured items, and one cannot guarantee that such shapes will not appear in the field of view containing the target. The appearance of such a shape in the same field of view as a target composed of circles or arcs of circles results in potential confusion for the alignment method, and this confusion usually leads to higher recognition error rates under variations in image quality typically encountered in an industrial environment.

A third limitation of rotationally symmetric targets is that they are often not good choices for measuring size, what might be called "size alignment". While such a target does contain plenty of information for conveying size, the concentric circular boundaries match each other perfectly at many different sizes. At the correct size the overall target match will be higher than at any of the wrong sizes, but the matches at the wrong sizes are sometimes good enough to create confusion under realistic conditions of image degradation. This "self-confusion" can lead to higher recognition error rates. Furthermore, this self-confusion generally requires that any practical alignment method must examine the "size" degree of freedom more carefully to avoid error, which increases recognition time.

The academic literature has also considered using as alignment targets simple polygons such as squares and diamonds, as well as complex sequences of stripes that are optimal for 1D or 2D alignment in some theoretical sense, but are almost impossible to manufacture.

Known targets in commercial use include simple geometric shapes such as circles, bull's-eyes, squares, crosses, two squares touching at a corner, and patterns consisting of a cross embedded in a circle.

In the semiconductor industry, significant attention has been given to the engineering of targets used to achieve the extreme accuracy needed to register the many layers created during wafer processing. Early targets consisted of interleaved comb structures, which were used by human operators in manual alignment systems prior to the advent of machine vision alignment. More recently, manufacturers have used squares, concentric "box-in-box" shapes, crosses, circles, rings, bull's-eyes, and various other shapes comprised of rectilinear or circular features. Much of the prior art in semiconductors is concerned with process issues such as 3D structure, edge profiles, circuit design rules, and resist flow.

Prior art cooperative targets suffer from one or more of the following limitations:
- Target features are sometimes inadequate for providing sufficient information regarding non-translation degrees of freedom (e.g., orientation and size).
- Reduced information is available when straight-line features are aligned (accidentally or otherwise) with the pixel grid.
- Confusion and consequent reduced reliability result from use of circles, circular arcs, line segments, or right angles, which are common in manufactured objects, and therefore may be confused by the alignment method with other patterns in the scene.
- Reduced reliability results from use of fine target features that do not survive a manufacturing process.
- Confusion and consequent reduced reliability result from target shapes that are "self-confusing", i.e., that match themselves too well when translated, rotated, or changed in size.
- Reduced alignment speed results from target shapes that cannot be identified unambiguously by their coarsest features.

For a number of reasons these limitations generally have not been serious for past use of machine vision. The alignment methods that have been available in the past, such as blob analysis and normalized correlation, had not been accurate enough (i.e., could extract only limited information from an image) to expose subtle limitations of the targets. Few practical methods existed for determining non-translation degrees of freedom: and those that were known were not widely used due to cost, reliability, or performance problems. Machine vision was often a new and challenging manufacturing technology, and so emphasis was placed on basic functionality and not on squeezing high performance from the equipment. In electronics and semiconductor applications, among the largest users of machine vision, the coarser device geometries of the past placed limited demands on machine vision alignment.

Recent developments have created a need for a new breed of cooperative targets:
- The commercial availability of practical, highly accurate alignment methods capable of aligning non-translation degrees of freedom, including orientation and size, has created a need for targets engineered to provide sufficient information in all such degrees of freedom.
- Expanding experience with machine vision alignment has shown that increased error rates often result from targets that can be confused with similar shapes in the field of view, or are self-confusing in one or more degrees of freedom. Thus, there is a need for targets not based on common features such as lines, right-angles, and circles, and for targets specifically engineered to minimize or eliminate self-confusion in all degrees of freedom.
- Shrinking sizes and tighter tolerances in manufactured goods, particularly in semiconductors and electronics, are placing increasing demands on accuracy, speed, and robustness of machine vision alignment. Consequently, there is a need to reconsider the often-neglected role of target shape, and produce targets that cooperate with practical alignment methods to achieve best performance.

The need for new cooperative targets not subject to the limitations of the prior art leads to a need for new methods for engineering such targets. Prior art methods for engineering targets suffer from one or more of the following limitations:
- The known target engineering methods address only translation alignment, not other degrees of freedom such as orientation and size.
- The known target engineering methods are based on a theoretical analysis of absolute accuracy, which to avoid intractable complexity, requires unrealistic simplifying assumptions about image quality, requires that target shape be restricted to simple shapes composed of circles and rectilinear edges, and requires the use of simple binary alignment methods, such as blob centroid.
- The known target engineering methods do not consider alignment speed.
- The known target engineering methods do not consider alignment reliability under practical conditions of image variation and process degradation.
- The known target engineering methods do not consider confusion with other patterns and self-confusion.

Consequently there is a need for a new method for engineering alignment targets.

Another factor contributing to reduced performance of known cooperative alignment targets is insufficient precision in known methods for rendering such targets. Without the ability to render a cooperative alignment target at very high precision, an alignment target engineered to address the problems of the prior art would not perform optimally.

Consequently, it is necessary to be able to render such targets in various forms, including bitmap images, at very high precision. In the prior art, methods for rendering shapes accurately on a discrete grid have been studied extensively for graphics applications, where they are generally referred to as anti-aliasing methods. These methods produce pleasing graphics for human observation, but achieving the extreme accuracy and flexibility needed for machine vision alignment applications is difficult.

In the machine vision prior art, several methods have been used to render binary shapes on discrete grids. In one method, pixels along the shape boundary are given a gray value corresponding to the fraction of the pixel's area that falls on either side of the boundary. This method suffers from several limitations:

The computations are complex, resulting in very slow rendering that makes automated testing using thousands of synthetically generated images impractical.

The method assumes an unrealistically ideal sensor model, resulting in loss of accuracy. Attempts to improve the sensor model by post-processing the rendered image are also limited in accuracy due to grid quantization.

The method is impractical for complex shapes that are not composed of straight-line segments.

In another known rendering method, a binary image is rendered at much higher resolution than that needed for the target rendering. This high-resolution image is then filtered and sub-sampled to produce the final rendering. While such a method can be quite accurate in principal, computer time and memory limitations make truly high accuracy impractical.

SUMMARY OF THE INVENTION

It is well-known in the prior art to cause a cooperative target to appear on an object to be located, place the object within the field of view of a camera or other suitable image formation device, capture an image of the object bearing the target, and analyze the image using an alignment method to determine the x-y position of the target in the image.

The invention includes a method and apparatus for locating objects by means of machine vision alignment using cooperative targets. The method and apparatus provides significant improvements over the prior art. In one general aspect, the invention uses novel cooperative targets that have substantial performance advantages over those used in the prior art. In another general aspect, the invention uses alignment methods having non-translation alignment capabilities, such as geometric pattern recognition, cooperating with suitable targets to perform alignment in non-translation degrees of freedom, such as orientation and size.

The invention includes a novel set of criteria for evaluating alignment targets for accuracy, speed, yield (robustness), and ease of use. The accuracy criteria of the invention are based on a quantitative analysis of target boundary shape that has several advantages over prior art methods:

The accuracy criteria of the invention can be used for essentially arbitrary shapes;

The accuracy criteria of the invention provide estimates of the information content of a cooperative target, independent of any specific alignment method; and The accuracy criteria of the invention can evaluate targets for their capacity to accurately align non-translation degrees of freedom, such as orientation and size.

The accuracy criteria of the invention also include a quantitative measure of the tendency of a target to contribute to loss of accuracy due to accidental alignment with the pixel grid of the machine vision system, a phenomenon referred to herein as "grid degeneracy". This phenomenon has been recognized in academic research, although useful remedies appear not to have been investigated, and many cooperative targets in current use suffer from this problem.

Although speed criteria are apparently unknown in the prior art, an aspect of the invention includes qualitative criteria based on certain common characteristics of most practical alignment methods in use, which are in turn loosely based on principals of information content.

Yield criteria are also apparently unknown in the prior art, with the exception of targets used for wafer fabrication in the semiconductor industry, where the criteria are specific to wafer processing. For high yield (low error rates), an aspect of the invention considers the ability to survive manufacturing processes and other environmental conditions. Another aspect of the invention includes criteria relating to potential errors caused by self-confusion and background confusion.

The ease-of-use criteria of the invention require that targets be easy to render on the objects to be located, easy to teach to the machine vision alignment method, and easy to analyze using the criteria of the invention. To satisfy these ease-of-use criteria, the invention uses targets that are defined by a set of algebraic formulas.

The invention includes a novel method of accurately rendering algebraically defined shapes that can be used to render alignment targets, or for other purposes. The method can render shapes as a bitmap image for machine vision alignment training, for computer display for human observation, and for computer printout for documentation. The method can aid in rendering targets on the objects to be located by providing input to a computer-aided design (CAD) system, or by directly controlling devices such as laser engravers. The rendering method of the invention is fast, extremely accurate, and can handle substantially arbitrary shapes.

The rendering method according to the invention includes two key steps: first, targets are defined by a real-valued function of position in the real plane that gives the distance from that position to the nearest point on a target boundary. The function gives distance as a positive value for points inside the figure, and as a negative value for points outside the figure; and second, an edge model is used to map distance to real-valued image intensity. By choosing appropriate edge model parameters, edge sharpness, focus, video gain, and noise can be modeled. Other steps are used with these two key steps to provide a complete rendering method. In a preferred embodiment, the rendering method of the invention uses high-precision floating point arithmetic to estimate real-valued functions on the real plane, and only converts to a discrete grid as the final step. The result is the ability to control the position, orientation, and size of the final rendering to extremely high precision.

The invention includes a novel method for engineering alignment targets that satisfy the above set of criteria of the invention. By contrast, known methods generally try to analyze a set of specific shapes, such as a circle, square, and diamond, and then simply choose the best one. Alternatively, in some known methods, a single parameter such as aspect ratio might be optimized according to some criteria. The method of the invention for engineering alignment targets, by contrast, starts with a simple shape and then refines the initial shape in a series of steps, where each such step produces a different shape, derived from the previous step, that resolves some deficiency of that shape.

In one embodiment of the method for engineering alignment targets, the initial shape contains radial features, which carry orientation information but not size, and circular features, which carry size information but not orientation. As recognized by the invention, this independence of radial and circular features allows orientation and size performance to be adjusted independently.

In another embodiment of the method, the starting shape is defined algebraically using polar coordinates. In a preferred embodiment, the starting shape is a "fan".

In a preferred embodiment, the series of steps includes at least one step whose purpose is to achieve at least one of the following goals:

Increase boundary perimeter to improve accuracy. In a preferred embodiment, perimeter is increased by adding holes.

Balance orientation and size accuracy, so that the target is not overly biased towards one degree of freedom at the expense of the other.

Reduce or eliminate rotational symmetry.

Reduce or eliminate orientation self-similarity.

Reduce or eliminate size self-similarity.

Reduce or eliminate grid degeneracy.

Reduce or eliminate features that are common in manufactured items, such as circles, circular arcs, straight lines, and right angles.

The alignment target engineering method of the invention provides at least the following benefits:

The alignment target engineering method of the invention allows objective, quantitative comparison of the ability of different shapes to convey alignment information in all relevant degrees of freedom, including translation, orientation, and size.

The alignment target engineering method of the invention, avoids fruitless theoretical attempts to determine absolute accuracy, and instead allows analysis of arbitrary shapes with no assumptions about image quality or the alignment method to be used.

The alignment target engineering method of the invention takes into account the effect of target shape on the speed of practical alignment methods in common use.

The alignment target engineering method of the invention takes into account the effect of potential confusion with other patterns, and self-confusion, on alignment reliability.

The invention includes specific alignment targets that have at least one of the following attributes:

They satisfy the invention's evaluation criteria.

They result from the use of the invention's engineering method.

They have no significant rotational symmetry.

They have no significant orientation or size self-similarity.

They are not primarily composed of circles, circular arcs, straight lines, or right angles.

In one embodiment, the specific alignment targets are shapes consisting of at least one "generalized polar polygon." A generalized polar polygon is a plane figure that is a polygon with optionally rounded vertices when drawn in polar coordinates, keeping in mind that all coordinates (r, θ+360°n), for integer n, are the same point. Such a figure will include radial lines, circular arcs, and spiral segments when drawn in the Cartesian plane.

In another embodiment, the specific alignment targets are members of a family of "fan" shapes.

In a preferred embodiment, the targets are fan shapes that satisfy all, or almost all, of the evaluation criteria established by the invention. These are novel shapes that have no prior history in mathematics or practical arts. Any target that substantially satisfies all of the evaluation criteria is called a "Universal Alignment Target" (UAT).

BRIEF DESCRIPTION OF THE DRAWINGS

The invention will be more fully understood from the following detailed description, in conjunction with the following figures, wherein.

DETAILED DESCRIPTION OF THE DRAWINGS

Figure 1:
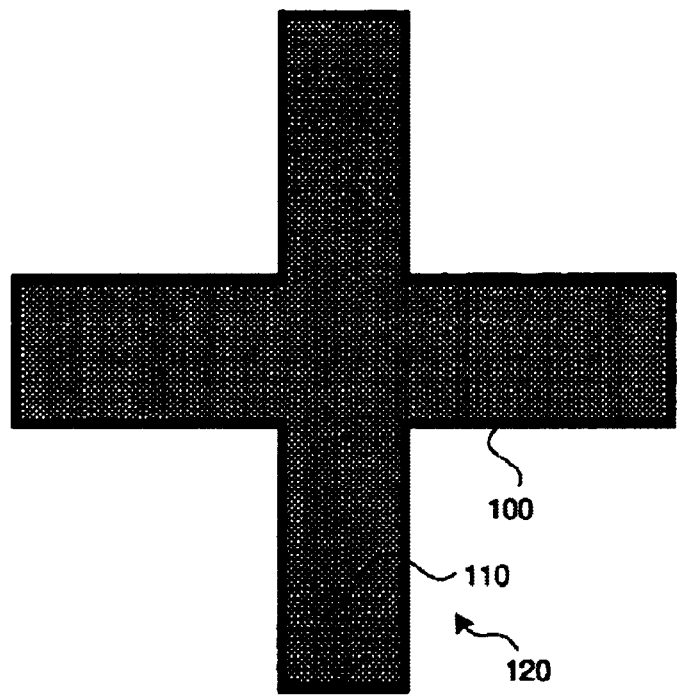
FIG. 1 (shows a typical cooperative target in common use, and illustrates some of the basic properties of targets considered by the invention.

FIG. 1 shows a typical cooperative target in common use, and illustrates some of the basic properties of targets considered by the invention.

Practical targets are characterized by discontinuities of some quantity (i.e. brightness, texture) at some appropriate granularity (spatial resolution). These discontinuities are boundary contours 100 (sometimes called edges), physical or subjective, that separate roughly uniform regions 110 and 120. Although it is possible to imagine targets with no uniform regions and no discontinuities, they are hard to fabricate and generally unreliable due to the well-known observation that image shading is much less consistent under real-world variations than the shape and position of the boundaries. Thus from this point forward we consider only targets characterized by boundaries separating roughly uniform regions.

We avoid all consideration of shading in the engineering of a target and consider only the shape of the boundaries. All shadings that can produce the boundaries are considered equivalent, and for simplicity we assume binary shading on the real plane. When targets are rendered on a discrete grid, however, the boundaries must be carefully shaded in grayscale to convey accurate boundary position and orientation information.

Information about a target's position is to be found exclusively along the boundary contours, for example 100. In uniform or uniformly-varying regions, for example 110 and 120, no position information is available for the simple reason that all points is such regions look the same. This is a fact of geometry that is independent of the alignment method—even area-based methods such as normalized correlation ultimately get their position information from these boundaries.

It is well-known that the shape of the boundary contours has some bearing on the ability of a target to provide information for specific degrees of freedom. For example it has long been observed that a circle cannot be used to measure rotation, a corner cannot be used to measure size, and a rectangle provides more translation information normal to its long axis than its short axis. These bits of intuition can be formalized, resulting in formulas for computing figures of merit that allow one to assess quantitatively the ability of a given shape to measure a given degree of freedom. The figures of merit are non-negative unbounded real numbers. For rotation and size, a single number each is defined. For translation, the figure of merit is a function of direction.

Alignment accuracy is determined by a combination of factors, the most important being the intrinsic capabilities of the alignment method, the information content of the target, and the magnitude of image degradation. The figures of merit measure the information content of the target only, and thus do not directly determine accuracy. Their value is that they allow targets to be compared quantitatively and independent of the alignment method in use.

Figure 2:
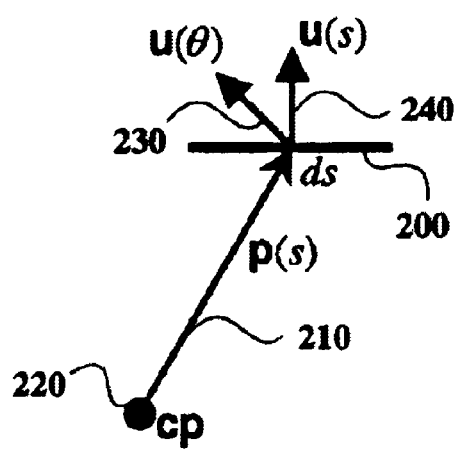
FIG. 2 illustrates how the figures of merit used for the accuracy criteria are computed.

FIG. 2 illustrates how the figures of merit are computed. Let the parameter s be arc length along a contour. Consider a small segment 200 of contour of length ds, at position defined by the vector p(s) 210 relative to some point cp 220. Define the unit vector U(s) 240 normal to the contour at p, and the unit vector U($\theta$) 230 in direction $\theta$, all as shown in FIG. 2.

The contribution to the figure of merit of a given degree of freedom by the segment is the area swept out by the segment per unit change in the degree of freedom. For rotation and size the change is about the point cp, further defined below. Thus segments oriented parallel to the direction of motion induced by a change in the degree of freedom sweep no area and contribute nothing to the figure of merit, and segments oriented normal to the direction of motion contribute the most. For rotation and size, the contribution is proportional to distance from cp, which is consistent with one's intuition.

From this discussion, the rotation, size, and translation figures of merit for any contour can be written as follows (note that the vector cross product in 2 dimensions produces a scalar):

$$R = \oint |u(s) \times p(s)| ds \quad (1)$$

$$S = \oint |u(s) \cdot p(s)| ds \quad (2)$$

$$T(\theta) = \oint |u(s) \cdot u(\theta)| ds \quad (3)$$

R and S are meaningless without a suitable choice for cp. Indeed one could make R and S arbitrarily large for any contour simply by choosing cp to be far away. One useful choice is the geometric point that minimizes the integral of squared distance between it and lines passing through and normal to the contour, which we call the center of projection. The center of projection can be computed as follows, where the x and y subscripts denote components of a vector:

$$q(s) = p(s) \cdot u(s) \quad (4)$$

$$g = \oint u_x^2(s) ds \oint u_y^2(s) ds - \left[ \oint u_x(s) u_y(s) ds \right]^2 \quad (5)$$

$$cp_x = \left[ \oint q(s) u_x(s) ds \oint u_y^2(s) ds - \oint q(s) u_y(s) ds \oint u_x(s) u_y(s) ds \right] / g \quad (6a)$$

$$cp_y = \left[ \oint q(s) u_y(s) ds \oint u_x^2(s) ds - \oint q(s) u_x(s) ds \oint u_x(s) u_y(s) ds \right] / g \quad (6b)$$

Figure 3:
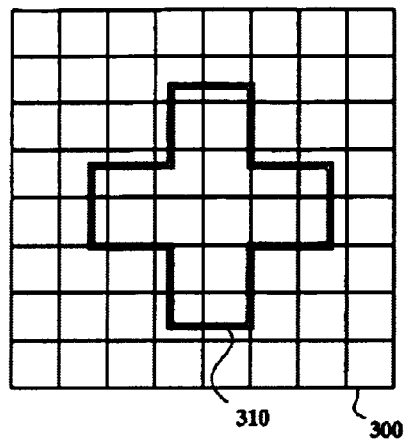
FIG. 3 illustrates an accidental alignment of a target to the machine vision system's pixel grid, which results in loss of information called a "grid degeneracy".
Figure 3:
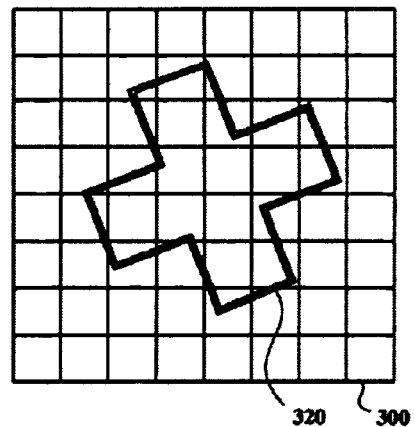
Figure 3:
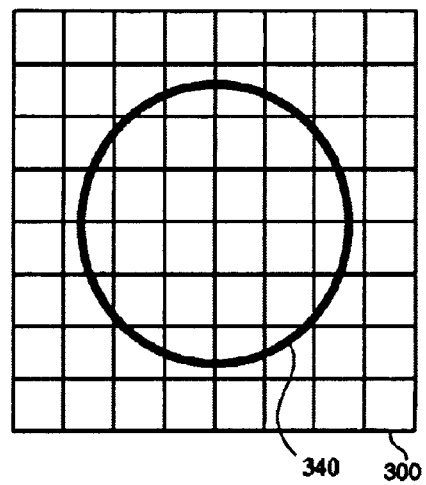

FIG. 3 illustrates an accidental alignment of a target to the machine vision system's pixel grid, which results in loss of information as discussed in the following paragraphs.

The figures of merit consider targets to be continuous boundary contours in the real plane. This is fine for analysis, but in practice images are represented as values on a discrete grid, for example 300. Unlike the real plane a grid is distinctly anisotropic—it has special directions, parallel to the grid axes and, to a lesser extent, parallel to the diagonals, which affect the information-bearing capacity of target boundaries that line up along those directions. The effect is subtle but significant, particularly for alignment methods with high intrinsic accuracy.

Consider the one-dimensional image intensity profile normal to a boundary contour, for example 310, 320, or 340, at some point. If the boundary moves by a whole pixel amount, the profile shifts correspondingly but its shape is unchanged. For fractional pixel shifts the profile shape changes, so that the shape of the profile encodes information about sub-pixel position, although there are practical limits on how much information can be extracted at any given point. If we consider the information provided by many such profiles at many points along the boundary, however, a significant improvement in position information content can be obtained, but only if the various boundary points represent statistically independent measurements.

If a target boundary cuts the pixel grid 300 in a random or pseudo-random manner, for example 320 and 340 statistical independence is high and maximum information is conveyed. On the other hand, if a portion of a boundary contour happens to line up parallel to a grid axis, for example 310 the intensity profile shapes at points along that portion are necessarily identical (except for measurement noise), and therefore provide no mutually independent information. It is as if only one point along the boundary portion is considered instead of many. Such an accidental alignment of target 310 to grid 300, and the resulting loss of information, is called a grid degeneracy. Grid degeneracy in principle affects any alignment method, whether intensity profiles are examined directly or only indirectly, but is most noticeable when the alignment method's intrinsic accuracy is very high.

The loss of accuracy associated with grid degeneracy is not always apparent. Some alignment methods do not have sufficient intrinsic accuracy for the effect to be measurable. In other cases, a method may use a model of intensity profile shape that happens to match well the behavior of specific images being tested. This may mask the grid degeneracy for those images, but since profile behavior is not reliable to high precision such a result is unreliable in practice.

Targets such as crosses, for example 310 and 320, and rectangles suffer most seriously from grid degeneracies because the entire boundary can be aligned simultaneously with the grid axes, as in 310. The worst case for such figures occurs when the target dimensions are close to a whole number of pixels, because no independent measurements are made anywhere along the entire boundary. If the dimensions are not close to a whole number of pixels, then at least some independent information can be obtained from different edges of the target (e.g. the left and right side of a rectangle).

Susceptibility to grid degeneracy is an important accuracy criterion in the engineering of an alignment target. A figure of merit GD one can use is the fraction of the target's boundary contours that can align with the pixel grid simultaneously. For rectangles and crosses GD is 1.0, the worst case. For circles 340 it is 0, the best case. Note that this figure of merit doesn't consider the effect of whole pixel dimensions.

Figure 4:
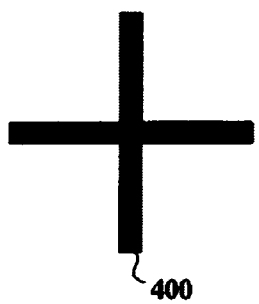
FIG. 4 illustrates the alignment speed criteria.
Figure 4:
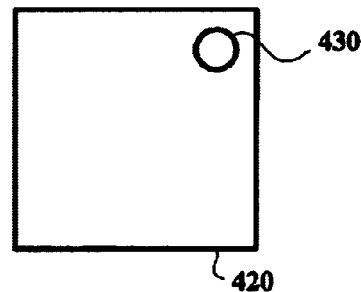

FIG. 4 illustrates the alignment speed criteria used, as further discussed in the following paragraphs.

For most practical alignment methods, the most important effect on speed of the engineering of a target is the extent to which the target can be identified unambiguously by its coarse features. This criterion is hard to quantify meaningfully, and so is more a matter of judgement. Fine detail itself is not a problem, but for best alignment speed it should be used to enhance accuracy and not to identify the target.

For example the thin cross 400 fails to satisfy this criterion, and is a poor choice for an alignment target. The cross 400 has only fine detail, no coarse features that can be used to estimate its location in a coarse resolution examination of the image.

Unambiguous identity based on coarse features applies to each of the degrees of freedom. Consider for example the target 420. The x-y position of this target is unambiguous when looking at its coarsest feature, the overall square shape. Its orientation, on the other hand, has 90° ambiguities until one looks at its finest feature 430. Although one should expect an alignment method to be able to determine the rotation of this target over a 0–360° range, the alignment time will be longer because fine detail must be examined in order to do so. Note that target 400 fails the speed criterion in all degrees of freedom.

Figure 5:
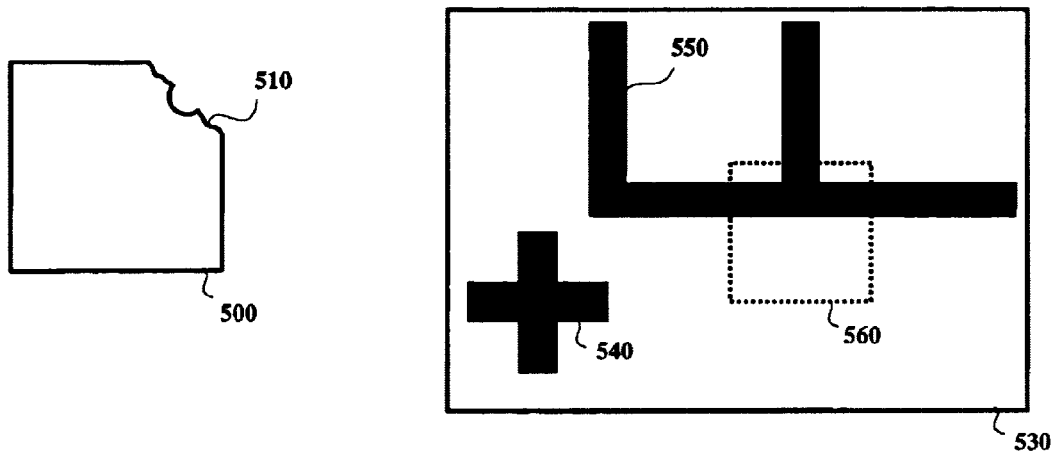
FIG. 5 illustrates the alignment yield criteria.

FIG. 5 illustrates the alignment yield criteria used, as further discussed in the following paragraphs.

In general the most significant factor affecting alignment yield is image degradation—if images were always perfect copies of the trained pattern, just about any alignment method would give 100% yield. Although image degradation may be intrinsic to the manufacturing process and difficult to control, there are some target engineering criteria that can help.

One form of degradation is where the target fails to survive the manufacturing process reasonably intact. For the most part survivability is an application-specific issue, but we can reasonably assume in general that coarse features will survive better than fine features. This is consistent with and perhaps more restrictive than the speed criterion, suggesting that at least for a UAT very fine features should be avoided.

The effects of degradation are mitigated when the target's shape is as dissimilar as possible both from other patterns in the field of view and from translated, rotated, or sized versions of the target itself (i.e., low auto-correlation secondary peak in all degrees of freedom). If the target is too similar in appearance to other patterns or itself, image degradation can wipe out differences and cause failures to find or misalignments. For example the target 420 is very similar to itself in 90° rotations. If image quality degrades significantly as in 500, the small difference 510 between the correct and false orientations can be hard to detect reliably.

Another example of self-similarity is a triangle in the size degree of freedom. Fully two-thirds of the boundary of a triangle will match a larger version of the same shape.

Similarity to other patterns in the field of view is of course application-specific, but again general guidelines are possible. Parallel and orthogonal features, and simple geometric shapes, are common in manufactured goods and are therefore best avoided in an alignment target intended to be universal.

Consider for example a portion of a printed circuit board 530 containing circuit traces 550 and an alignment target 540. Note that the traces in area 560 match 75% of the target 540. As long as image quality is near perfect the false target 560 can be distinguished from the real target 540. Under realistic conditions of image degradation, however, the similarity of area 560 to target 540 will result in a non-zero error rate.

Figure 6:
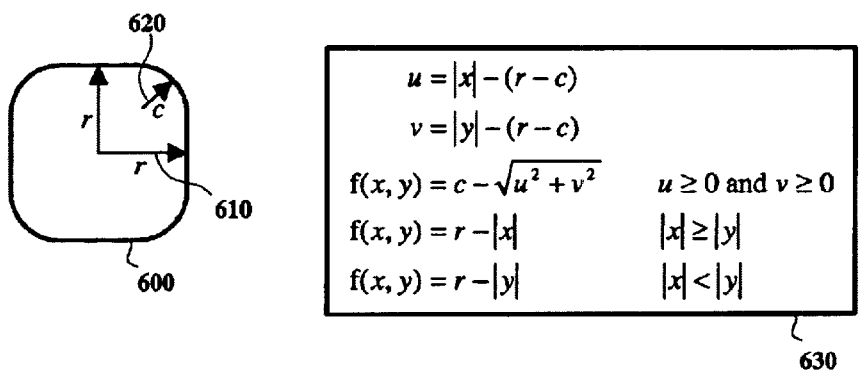
FIG. 6 illustrates a target defined by a set of algebraic formulas to satisfy the ease of use criteria.

FIG. 6 illustrates a target defined by a set of algebraic formulas to satisfy the ease of use criteria, as further discussed in the following paragraphs.

An alignment target should be easy to render, train, and analyze. Training includes both producing suitable shape information for an alignment method and selecting a known reference point on the target for reporting alignment position. Analysis includes computing the figures of merit.

Since all alignment methods in common use can be trained from images, and since there is no other generally accepted format for providing shape information, a high quality pixel-grid rendering of a target is considered necessary and sufficient for training a target. Realistically shaded edges are considered essential for providing accurate shape information, so for example targets generated by the typical "paint" programs are unacceptable.

Targets drawn by hand using painting or drawing programs, or acquired from a physical device such as a video camera, are difficult to analyze, usually do not allow precise selection of a reference point, and may be difficult to render in whatever substrate will contain the target in the alignment application. Such targets are not suitable for use as a UAT.

The objectives are met by targets that are defined algebraically in the real plane. In a preferred embodiment, a target is defined by a real-valued function of real-valued coordinates f(x, y) such that f gives at each point (x, y) the distance and direction (+ or −) to the nearest boundary contour. The contours are defined by f(x, y)=0, the points inside the contours as f(x, y)>0, and outside as f(x, y)<0.

For computational simplicity the method does not require that f(x, y) give precise distance, only that the value is reasonably close. This simplification has been found useful for targets best defined in polar coordinates, such as the fan configurations, which are derived from the function's Cartesian arguments.

For example target 600 is a square of radius 610r, and with corners rounded to radius 620c. The target is defined according to a preferred embodiment by defining the function f using the set of algebraic formulas 630.

A set of algebraic formulas defining a target provides a universal and unambiguous definition, which can serve as the basis for a computer program that can render the target for various purposes:

Training The rendering program can produce a bitmap image that can be fed directly to an alignment method for training. The target reference point is also defined algebraically. As a result, training is fully automatic, with no human involvement and no need to even acquire a training image from a camera.

Reproduction The rendering program can be used to reproduce the target on the substrate used in the alignment application. Source code for the program can be delivered to manufacturers of CAD systems, laser engravers, and the like for use in their products. Source code is absolutely precise and unambiguous, can be independently tested and certified, can be distributed by email or published on Web sites, and is ultimately what just about any mechanical rendering device will need. Of course what makes a target easy to render is somewhat application-specific. For example, some processes may be able to render only horizontal and vertical features. Nevertheless algebraically-defined targets with appropriate software are flexible enough to handle most application-specific requirements.

Documentation The rendering program can produce pictures of the target for written documentation, as was done in the production of this patent specification.

Analysis The rendering program is used to drive analysis software that computes figures of merit by numerical integration. Since the rendering program itself drives the numerical integration, the results are guaranteed to correspond to the target as rendered.

Testing The target is defined on the real plane and the rendering program approximates this using high-precision floating point calculations. As a result the target can be translated, rotated, and sized to effectively arbitrary precision prior to rendering as a discrete image. Various edge, lens, and noise models can be applied in the floating point domain. The resulting images can be used for fully automated accuracy, speed, and yield testing.

Figure 7:
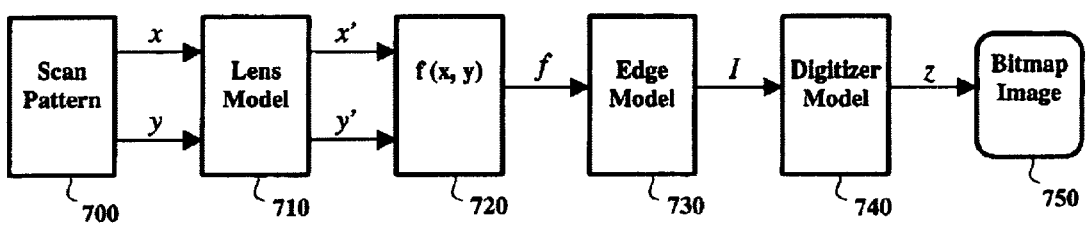
FIG. 7 illustrates a preferred rendering method according to the invention.

FIG. 7 illustrates a preferred rendering method according to the invention. This method for algebraic rendering and analysis of targets has been found by experience to be remarkably simple, as measured in number of lines of code needed, and in general, as measured by the variety of targets that can be generated. Following the preferred method, a target is defined by a real-valued function of real-valued coordinates f(x, y) as described above and illustrated by example in FIG. 6.

A scan pattern generation step 700 is used to generate a sequence of real-valued coordinates (x, y) as appropriate for the rendering to be made. For example, to render a bitmap image the coordinates would correspond to the centers of the image pixels. For guiding a laser engraver, the coordinates would correspond to beam position.

An optional lens model step 710 is used to apply a coordinate transform to model the imaging geometry, which maps the scan pattern coordinates (x, y) to new coordinates (x', y'). Typically an identity transform is used, but translation, rotation, size, aspect ratio, skew, perspective, and lens distortion transforms can be applied. These transforms are of particular value for alignment method accuracy testing, because the amount of transformation is precisely known.

A computational step 720 is used to compute the shape-defining function f(x', y'), which results in a real-values estimate of distance to the nearest boundary contour.

An edge model step 730 is used to apply a real-valued brightness transform that models edge sharpness, focus, video gain, noise, and other physical processes.

A digitizer model step 740 is used to convert the brightness values I as appropriate for the final rendering, for example 8-bit integers for monochrome bitmap images 750.

The only target-specific software needed is the code to implement the function f(x, y) in step 720. The above example target of FIG. 6 requires around 20 lines of code in the Visual Basic programming language; the complex UAT shown in FIG. 15 requires around 200.

Target-independent software follows the target contours defined by f(x, y)=0 and performs the numerical integration needed to compute the figures of merit. A small amount of target-specific software to provide a list of contour starting points is used. The contour following software can also generate a line-drawing of the target if such is needed.

A system for target generation follows an object-oriented approach with targets implemented by polymorphic objects and used by target-independent rendering and analysis software. Such a system would include a GUI for parameter selection and display of images and other results.

The above description relies on hard-coded implementations of f(x, y), which results in high rendering speed and simple software design. It is also possible to implement a "universal" function $f_u$ that uses a general-purpose shape description in the form of lines and arcs, such as a CAD description. With such a method creating a new target shape would be simpler and require no programming, but a larger one-time software effort would be needed to implement $f_u$ and rendering and analysis would be slower. A complete system for target generation would include both universal and specialized functions.

Figure 8:
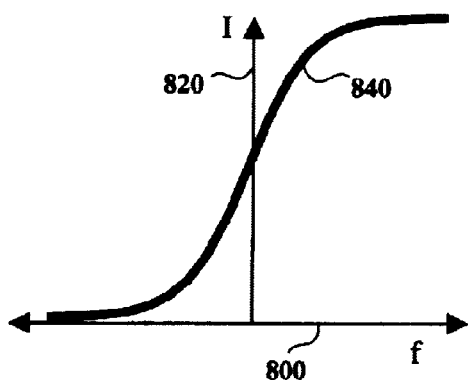
FIG. 8 shows an edge model used in a preferred embodiment of the rendering method.

FIG. 8 shows an edge model used in a preferred embodiment of rendering step 730. The figure shows the f coordinate axis 800, which represents distance (+ or −) to the nearest boundary contour, and the brightness coordinate axis 820. In a preferred embodiment, a sigmoid function 840 is used:

$$I = \text{background} + \frac{\text{contrast}}{1 + e^{-f/\sigma}} \qquad (7)$$

This edge model is easy and fast to compute, produces excellent anti-aliased edges, and allows precise control of edge sharpness using the parameter σ.

Figure 9:
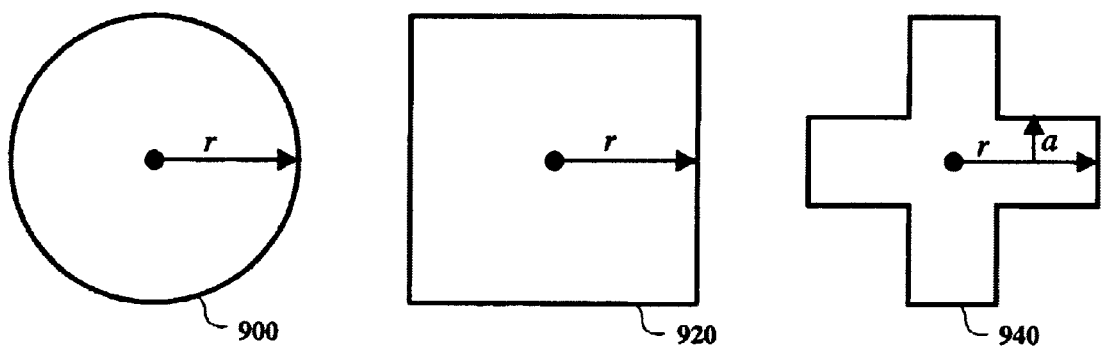
FIG. 9 illustrates some common alignment targets that are used as a reference point in the engineering of novel, high performance targets according to the invention.

FIG. 9 illustrates some common alignment targets that are used as a reference point in the engineering of novel, high performance targets according to the invention. For clarity we start with simple geometric shapes and build in small steps towards the goal. It should be clear that the resulting UAT is not unique, and that many variations, both minor and substantial, would be consistent with the spirit of the procedure and may be more suitable for specific applications.

Speed and yield criteria are based on an analysis of the degree of similarity between the target and other patterns. Similarity is somewhat dependent on the alignment method in use, particularly on whether the method is primarily based on areas, or on boundaries. While different methods may disagree on the degree of similarity between two patterns, in general there is necessarily much more agreement than disagreement.

In the following development, similarity is considered based on boundary matching, not area matching. While the analysis is therefore more directly applicable to boundary-based methods, it is still largely method independent since boundary shape determines area shape. The UAT that results is a superb target for use with just about any general-purpose method.

Consider first a circle 900 of radius r. The figures of merit are given in table 1.

TABLE 1

| | | Circle | | |
|---|---|---|---|---|
| R | S | worst T(θ) | best T(θ) | GD |
| 0 | 6.28 r² | 4.0 r | 4.0 r | 0 |

As can be seen there is no information for measuring rotation and no grid degeneracy. The scale figure of merit is pretty good but the translation figure could be better. If we ignore the rotation degree of freedom, speed and yield criteria are satisfied as long as no similar shapes appear in the field of view. Circles are common shapes, however. Of course we don't need all of this analysis to know that a circle is a poor choices for a UAT, but the numbers give a point of comparison when considering other shapes.

Now consider a square 920 of radius r, whose figures of merit are given in table 2.

TABLE 2

| | | Square | | |
|---|---|---|---|---|
| R | S | worst T(θ) | best T(θ) | GD |
| 4.0 r² | 8.0 r² | 4.0 r @ 0° | 5.66 r @ 45° | 1.0 |

All degrees of freedom can be measured, although twice as much information is available to measure size as rotation (these figures can be compared directly, but cannot meaningfully be compared with the translation figures). A factor of √2 imbalance also exists between the best and worst translation directions. These imbalances are not serious, but neither are they ideal. Grid degeneracy is worst case. Speed is good, but the square will match itself perfectly at 90° rotation increments, and 50% of its boundary will match a corner or a much larger square. These self-similarities, combined with the fact that it is a common shape, fail to satisfy our yield criteria.

Next consider a cross 940 of radius (half-width) r and arm radius (half-thickness) α, whose figures are given in table 3.

TABLE 3

| | | Cross | | |
|---|---|---|---|---|
| R | s | worst T(θ) | best T(θ) | GD |
| 4.0 r² | 8.0 a (2r − a) | 4.0 r @ 0° | 5.66 r @ 45° | 1.0 |

Interestingly, except for the size degree of freedom the figures are identical to those of a square. This makes sense since the boundaries of a cross are identical to those of a square in perimeter length and orientation; a cross is just a square with its corners folded in. Considering just these figures of merit, then, a cross is never better than a square, and always worse in size measurement capability.

Other factors may come into play, however. Recall that GD does not capture the ability to mitigate the effects of grid degeneracy by choosing the dimensions of the target to be non-whole-pixel amounts. With a square there are only two independent edges potentially providing translation information (it's not 4 because there are 2 translation degrees of freedom). With a cross with sufficiently thick arms, we get 4 edges for each translation degree of freedom, assuming that none of the 6 possible pairs of the 4 edges are separated by a whole number of pixels. Thus a cross can be made less susceptible to grid degeneracy than a square, but only by careful engineering.

Another factor that might favor a cross is that in some applications scene real estate may be too limited to allow using a square, but a cross can be squeezed in between other portions of the scene.

Thin crosses fail to meet the speed criteria due to lack of coarse features, and all crosses suffer from the same yield concerns as squares.

Since crosses are commonly used as alignment targets in spite of these problems, the above analysis is summarized in the following guidelines for their use:

1. Make the arms as thick as possible
2. Make the edge-to-edge dimensions not be whole numbers of pixels.
3. Round the corners if possible to further reduce grid degeneracy.

Figure 10:
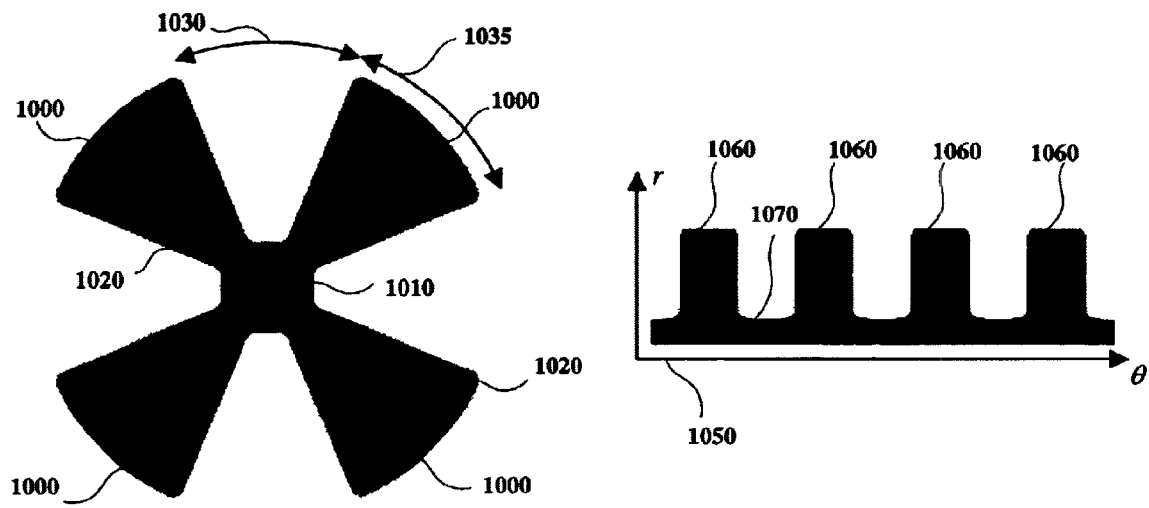
FIG. 10 illustrates a starting shape, the "primitive fan", according to a preferred embodiment of the target method of the invention.

FIG. 10 illustrates a starting shape according to a preferred embodiment of the target engineering method of the invention. This starting point and the shapes derived from it have proven to be productive in engineering superb alignment targets. The shapes are based on a basic shape-type that we call a fan. Other starting points and refinement decisions are possible, and no implication is made that the fan shapes are best. They are the best we've developed to date, however, and the principles used to engineer them can be applied in exploring other configurations.

The primitive fan shape (primfan) is shown in FIG. 10. It consists of 4 blades 1000 connected to a central circular hub 1010. All inner and outer corners, for example 1020, are rounded to avoid sharp corners that are hard to fabricate in many substrates, and often fail to survive harsh environments.

All of the fan shapes that are considered herein are defined by straight-line segments in polar coordinates. The vertices where these segments intersect are rounded by segments of circles, also in polar coordinates for simplicity. Thus the actual shape of the rounded corners in the final Cartesian rendering is complex, but for the small radii used they look just fine. A plane figure constructed from line segments in polar coordinates, with optionally rounded vertices, is called a generalized polar polygon.

In FIG. 10 the primfan is also drawn in a polar coordinate system 1050. The blades 1060 and hub 1070 can be seen.

Here and below the radius of the fan is r. The parameters defining this particular primfan are given in table 4, and the figures of merit in table 5.

TABLE 4

Primfan parameters

| | |
|---|---|
| Fan radius | r |
| hub radius | 0.2 r |
| blade width 1035 | 45° |
| blade gap width 1030 | 45° |
| corner radius | 0.047 r |

TABLE 5

Primfan

| R | S | worst T(θ) | best T(θ) | GD |
|---|---|---|---|---|
| 3.84 r² | 3.27 r² | 6.11 r @ 22.5° | 6.50 r @ 0° | 0.31 |

The worst case translation figure for the fan is better than the best case for circles, squares, and crosses of equal radius, and 53% better than the worst case for those targets. This is because more perimeter is packed into the same area, and better balanced in orientation. GD is pretty good at 0.31, corresponding to 4 of the 8 blade edges simultaneously subjected to grid degeneracy. The figures for rotation and size are a little small and somewhat imbalanced, but not bad either.

Speed is excellent due to unambiguous coarse features. There is of course the 90° symmetry, and self-similarity in size is also too large due to the fact that the radial features, which comprise 63% of the total perimeter, match perfectly as size changes. The fan is not a common shape, however, and is not likely to be confused with other patterns in the field of view.

Figure 11:
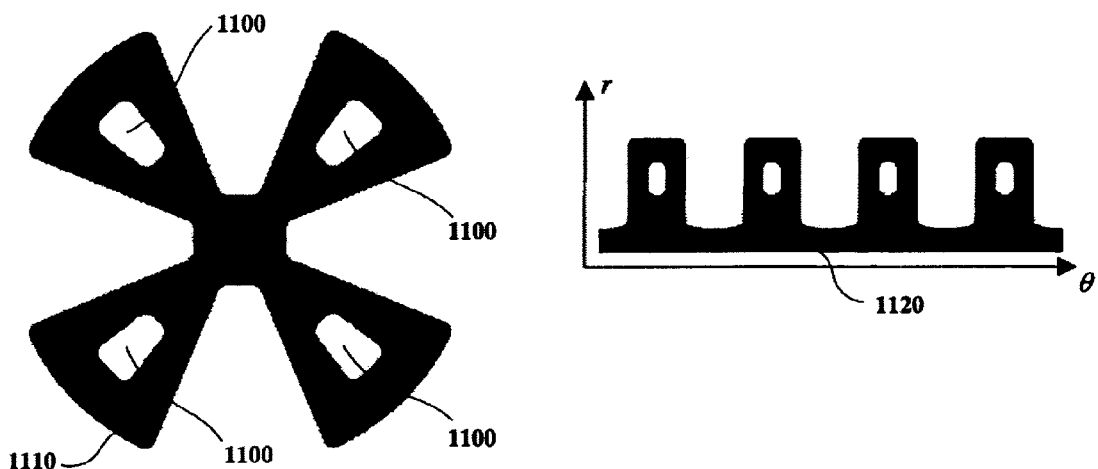
FIG. 11 shows the first refinement in the fan series, the "simple fan".

FIG. 11 shows the first refinement in the fan series. Holes 1100 are added in the blades, resulting in the simple fan shape 1110 (simfan), with hole parameters given in table 6 and figures of merit in table 7. The simfan is also drawn in polar coordinates 1120.

TABLE 6

Simfan hole parameters

| | |
|---|---|
| hole inner radius | 0.5 r |
| hole outer radius | 0.8 r |
| hole width | 15° |

The additional perimeter improves all of the figures of merit. R and S are somewhat more imbalanced, though, as the defined boundary squeezes more information out of the rotation degree of freedom than size.

TABLE 7

Simfan

| R | S | worst T(θ) | best T(θ) | GD |
|---|---|---|---|---|
| 5.40 r² | 4.19 r² | 8.20 r @ 45° | 8.83 r @ 0° | 0.24 |

Speed is still expected to be excellent. The rotation 90° ambiguity hasn't been addressed, but the size self-similarities are reduced because the holes won't match at the wrong size.

Figure 12:
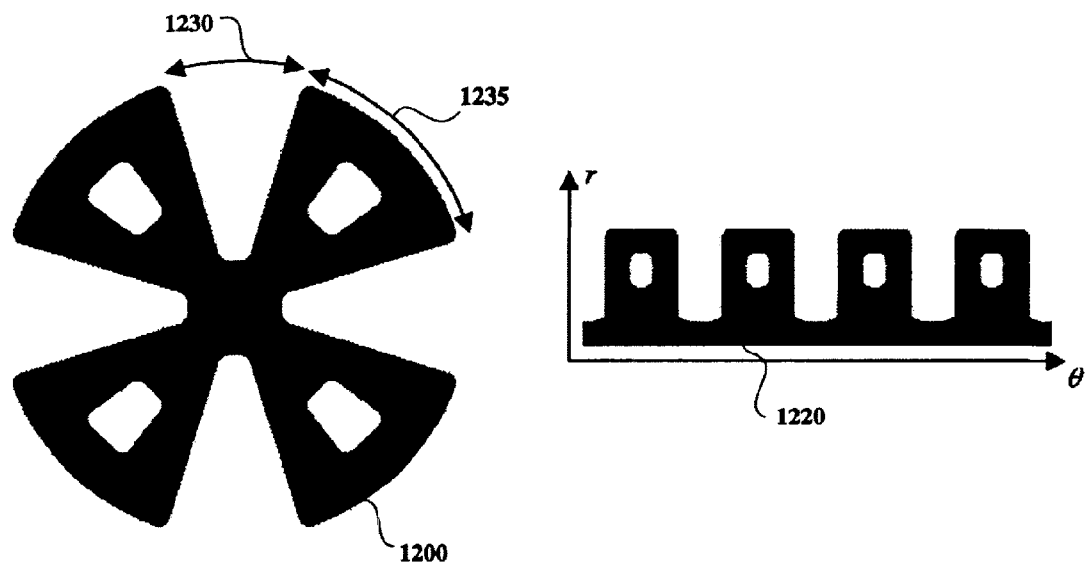
FIG. 12 illustrates the next refinement step, the "balanced fan."

FIG. 12 illustrates the next refinement step. One advantage of the fan configuration is that since it is composed of radial and circular features, rotation and size performance can be controlled independently. With a simple change we can bring up S without affecting R. The result 1200 is called a balanced fan (balfan), also shown in polar coordinates 1220. The defining parameters given in table 8, and the figures of merit in table 9.

TABLE 8

Balfan parameters

| | |
|---|---|
| Fan radius | r |
| hub radius | 0.2 r |
| blade width 1235 | 56° |
| blade gap width 1230 | 34° |
| corner radius | 0.047 r |
| hole inner radius | 0.5 r |
| hole outer radius | 0.8 r |
| hole width | 18.67° |

Note that all we've done is widen the blades to 56°, and widen the holes proportionally (the holes are $\frac{1}{3}^{rd}$ the blade width).

TABLE 9

Balfan

| R | S | worst T(θ) | best T(θ) | GD |
|---|---|---|---|---|
| 5.40 r² | 5.15 r² | 8.92 r @ 45° | 9.31 r @ 0° | 0.22 |

Note that the figures of merit are fairly well balanced, hence the name of the fan, and numerically better than simfan and much better than any of the simple geometric shapes we considered above. Speed and yield are neither better nor worse than simfan.

Figure 13:
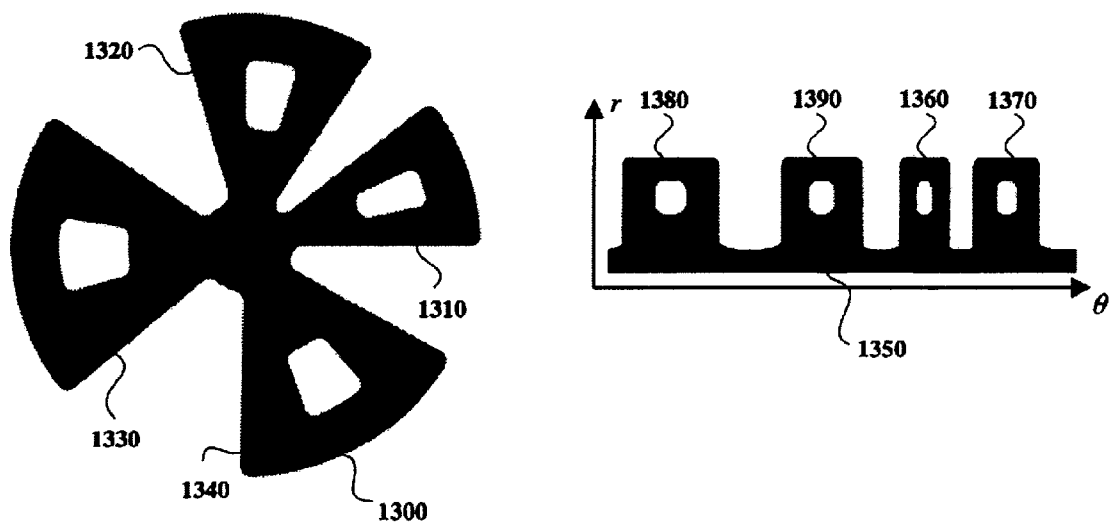
FIG. 13 illustrates the next refinement, the "balanced asymmetric fan."

FIG. 13 illustrates the next refinement, which is to fix the 90° ambiguity. This is done by making each blade and gap a different size. The resulting shape 1300 is called a balanced asymunetric fan (basfan), also shown in polar coordinates 1350. This basfan has the same total blade and gap width as the balfan, so that the figures of merit that we worked to balance are not significantly changed. As before the holes are kept at $\frac{1}{3}^{rd}$ the blade width.

The parameters describing the blades are given in tables 10a and 10b, with figures of merit in table 11. All of the radial and rounding parameters are as for previous fans.

TABLE 10a

Basfan parameters

| Blade | Starting Azimuth | Width |
|---|---|---|
| 1310, 1360 | 0° | 38° |
| 1320, 1370 | 57° | 50° |
| 1330, 1380 | 146° | 74° |
| 1340, 1390 | 269° | 62° |

TABLE 11

Basfan

| R | S | worst T(θ) | best T(θ) | GD |
|---|---|---|---|---|
| 5.42 r² | 5.21 r² | 8.64 r @ 38° | 9.47 r @ 134° | 0.11 |

Note, as expected, that R and S are not significantly changed from balfan. The worst case T(θ) has dropped slightly, with the best case rising, which is not surprising. GD has gone down by half, since now no more than two blade edges can suffer simultaneously from grid degeneracy. Note that with 8 blade edges and 28 pairs it is essentially impossible to reduce this to just one edge, since the test for simultaneous grid alignment has to allow for approximate alignment.

Although we've eliminated the serious 90° ambiguity, there is still some rotation and size self-similarity in the basfan. Considering rotation, any blade edge will match any other at some angle, and any point on the circumference will match any other point on the circumference. The asymmetry of the basfan reduces but does not eliminate these matches, which will result in secondary auto-correlation peaks. In size, the blade edges will match over a wide range of sizes, although the radial edges of the holes will not.

In summary the basfan is good on all criteria of speed, accuracy, and yield, but there is still room for improvement.

Figure 14:
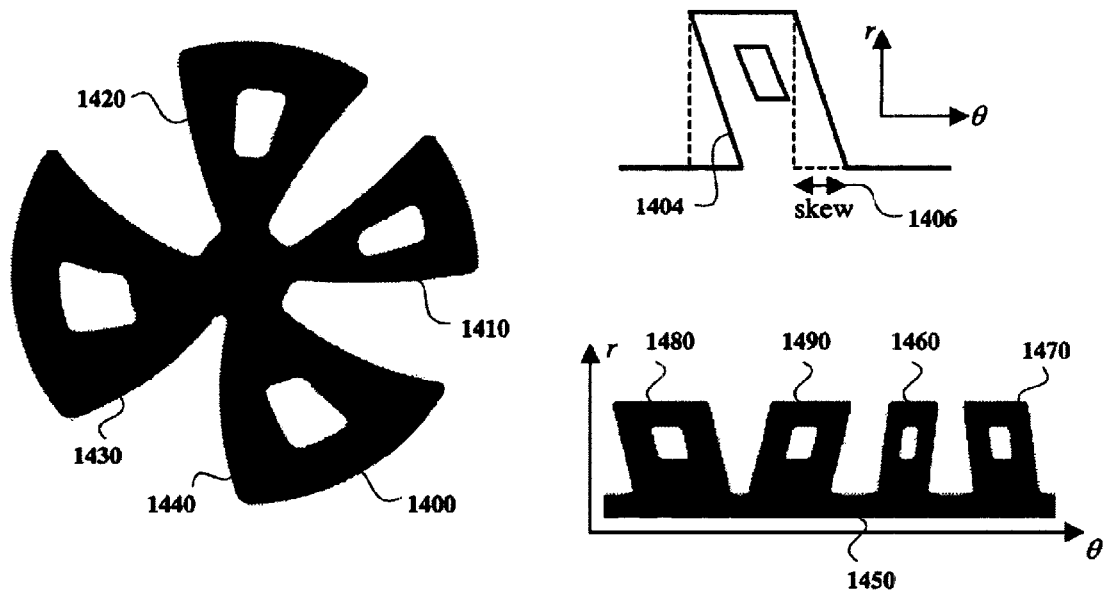
FIG. 14 illustrates the next refinement, the first version of the "balanced radically asymmetric fan."

FIG. 14 illustrates the next refinement. The radial features of previous fan configurations cause both grid degeneracy and self-similarity in size. A simple change to the formulas defining the fan in polar coordinates allows us to generate radial features that are sections of spiral curves, resulting in shape 1400. This is the first of two steps leading towards our final fan configuration, the balanced radically asymmetric fan (bradfan).

In polar coordinates, the bradfan after the first modification 1450 can be compared with the basfan 1350. Considering a particular blade 1404, the dotted lines show the blade edges before the change (basfan), and the solid lines show the blade and hole for bradfan 1400, 1450. As can be seen, the outer edge of the blade has not moved, but where the blade connects with the hub has been moved by an amount 1406 called skew.

The blade parameters for the bradfan so far are given in table 12.

TABLE 12

Bradfan parameters, step 1

| Blade | Starting Azimuth | Width | Skew |
|---|---|---|---|
| 1410, 1460 | 0° | 38° | 11° |
| 1420, 1470 | 57° | 50° | −11° |
| 1430, 1480 | 146° | 74° | −22° |
| 1440, 1490 | 269° | 62° | 22° |

This simple change eliminates all straight radial features in the final rendering, which eliminates grid degeneracy and size self-similarity. The skew parameters are chosen to be different for each blade, so that blade edges will not match those of other blades under rotation. This reduces some, but not most, of the rotation self-similarity. All figures of merit improve over basfan, as can be seen in table 13.

TABLE 13

Bradfan step 1

| R | S | worst T(θ) | best T(θ) | GD |
|---|---|---|---|---|
| 5.88 r$^2$ | 5.71 r$^2$ | 8.82 r @ 37° | 9.51 r @ 137° | 0 |

Figure 15:
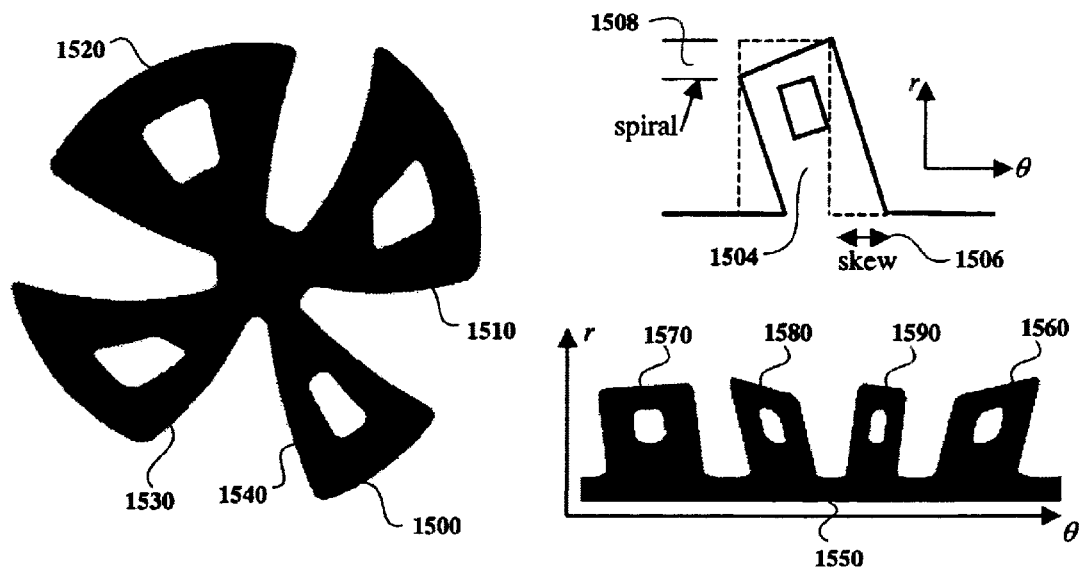
FIG. 15 illustrates the final alignment target shape, the "balanced radically asymmetric fan", which is considered a superb universal alignment target.

FIG. 15 illustrates the second and final step in making the bradfan, which eliminates the final rotation self-similarity. This is done by making the outer blade edges also spiral sections, instead of circular. The final bradfan 500 is shown, also drawn in polar coordinates 1550. A particular bradfan blade 1504 in polar coordinates shows both the skew parameter, 1506 and a new spiral parameter 1508. The complete blade parameters are given in table 14, and the final figures of merit in table 15.

Unlike previous fan parameters, which were chosen by hand, these parameters were obtained by an automated search of the 41,472 distinct arrangements of the 16 blade parameters, followed by a manual examination of the 100 highest ranking permutations.

TABLE 14

Final bradfan blade parameters

| Blade | Starting Azimuth | Width | Skew | Spiral |
|---|---|---|---|---|
| 1510, 1560 | 0° | 62° | 22° | 0.09 r |
| 1520, 1570 | 81° | 74° | −11° | 0.03 r |
| 1530, 1580 | 184° | 50° | −22° | −0.09 r |
| 1540, 1590 | 283° | 38° | 11° | −0.03 r |

The hub, hole, and rounding parameters are as before. Note that the spiral parameters are different for each blade to avoid rotation self-similarity.

TABLE 15

Final bradfan

| R | S | worst T(θ) | best T(θ) | GD |
|---|---|---|---|---|
| 6.12 r$^2$ | 6.12 r$^2$ | 9.06 r @ 137° | 9.50 r @ 68° | 0 |

The worst case translation figure of merit is over 9 r, which is 225% better than the worst case for a cross, and translation is well balanced over all angles. The automated search has given us superb and perfectly balanced R and S values. R is 53% better than a cross or square at the same radius, and S is just about what a complete circle would be.

The bradfan has no fine features and so should be fast to find and survive most manufacturing processes well. It has excellent figures of merit in all degrees of freedom and no grid degeneracy. It has no significant self-similarities in any degree of freedom, and looks nothing like any shape in common use. The bradfan is an ideal universal alignment target.

Figure 16:
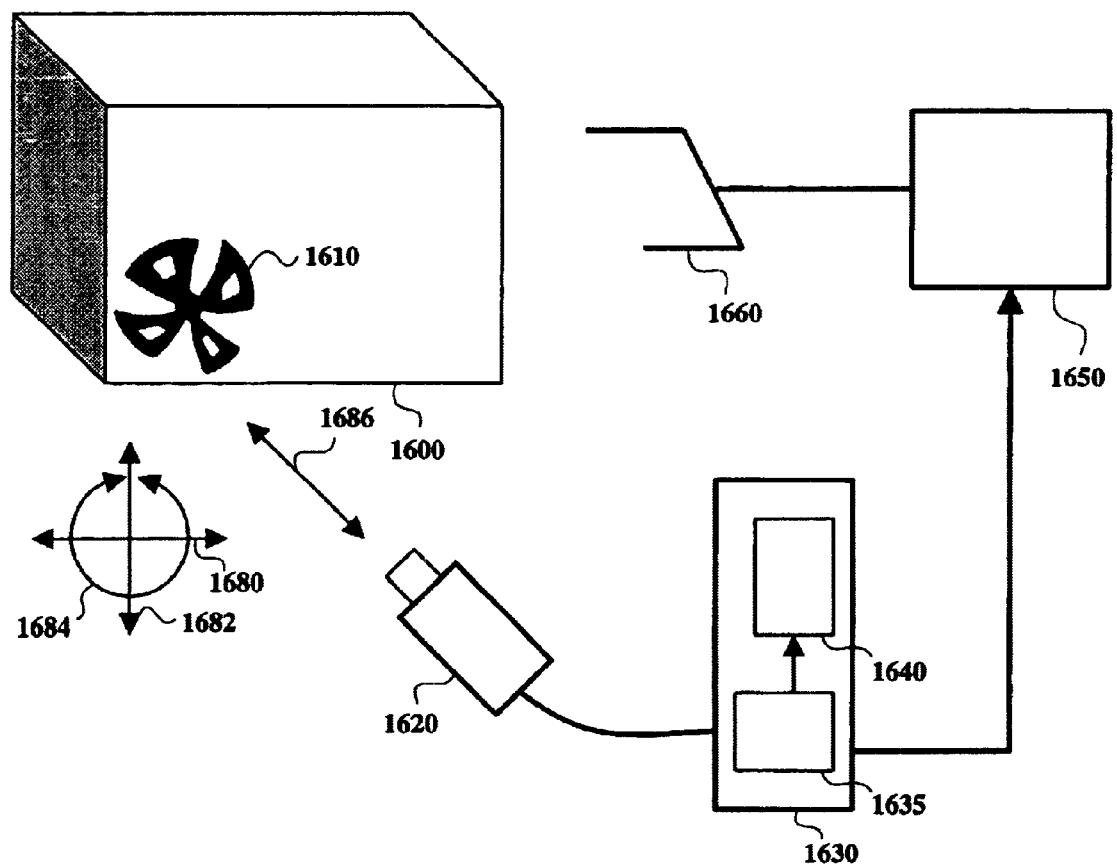
FIG. 16 illustrates an apparatus for locating objects using cooperative targets.

FIG. 16 illustrates an apparatus for locating objects using cooperative targets. An object 1600 is located somewhere in space relative to some object or device intended to grip, operate on, dock with, avoid, or otherwise interact with the object 1600, such as the illustrated robot gripper 1660. The object 1600 contains a cooperative target 1610. A camera or other suitable image forming device 1620 is located in a known position and attitude in space relative to the gripper 1660, and such that the cooperative target 1610 appears in the field of view of the camera 1620.

The object's location relative to the gripper 1660 and camera 1620 may be uncertain in various degrees of freedom, including translation degrees of freedom 1680 and 1682, orientation degree of freedom 1684, and distance degree of freedom 1686.

The camera 1620 is connected to a machine vision system 1630, which produces as part of its operation, using means well-known in the art, a digital image 1635. The digital image 1635 will contain an image of the cooperative target 1610. The location of the target in the image will be uncertain is various degrees of freedom, such as translation, orientation, and size, that correspond to the uncertainties in location of the object 1600 in space, for example 1680, 1682, 1684, and 1686, where said correspondence is described by well-known mathematical formulas.

The machine vision system 1630 contains an alignment algorithm 1640 that reads and analyzes the digital image 1635 to determine the location of the target in the digital image. Using this information the machine vision system 1630 computes the location in space of the target 1610 using well-known formulas, and communicates this information to some device, such as robot controller 1650, for use in gripping, operating on, docking with, avoiding, or otherwise interacting with the object 1600.

In one embodiment of the invention, the alignment algorithm 1640 is capable of aligning non-translation degrees of freedom such as orientation and size, and the cooperative target 1610 conveys sufficient information in such degrees of freedom to enable the alignment algorithm 1640 to make such measurements. In another embodiment of the invention, targets are used that have at least one of the following attributes:

They satisfy the invention's evaluation criteria.

They result from the use of the invention's design method.

They have no significant rotational symmetry

They have no significant orientation or size self-similarity

They are not primarily composed of circles, circular arcs, straight lines, or right angles.

In a preferred embodiment, a universal alignment target such as 1500 is used in conjunction with an alignment algorithm 1640 capable of aligning non-translation degrees of freedom, such as one of the many products available today offering such capabilities.

Other modifications and implementations will occur to those skilled in the art without departing from the spirit and the scope of the invention as claimed. Accordingly, the above description is not intended to limit the invention except as indicated in the following claims.

What is claimed is:

1. An alignment target comprising:
    a target characterized by a fan shape;
    the target having a plurality of blades; and
    at least one blade of the plurality of blades being different from another blade in the plurality of blades.

2. The alignment target according to claim 1 wherein:
    at least one blade of the plurality of blades having a width different from the width of at least one other blade in the plurality of blades.

3. The alignment target according to claim 1, further comprising:
    at least one blade of the plurality of blades having a width different from the width of all other blades in the plurality of blades.

4. The alignment target according to claim 1, wherein:
    each of the plurality of blades having a width different from the width of all other blades in the plurality of blades.

5. An alignment target comprising:
    a target characterized by a fan shape;
    the target having a plurality of blades; and
    at least one of the plurality of blades including at least one hole.

6. The alignment target according to claim 5, wherein:
    each of the plurality of blades includes at least one hole.

7. An alignment target comprising:
    a target characterized by a fan shape;
    the target having a plurality of blades separated by a like number of gaps to provide a plurality of gaps; and
    at least one of the plurality of gaps having a width different from the width of at least one other gap in the plurality of gaps.

8. The alignment target according to claim 7, wherein:
    at least one of the plurality of gaps having a width different from the width of all other gaps in the plurality of gaps.

9. The alignment target according to claim 7, wherein:
    each of the plurality of gaps having a width different from the width of all other gaps in the plurality of gaps.

10. An alignment target comprising:
    a target characterized by a fan shape;
    the target having a plurality of blades; and
    at least one of the plurality of blades having a non-zero skew.

11. The alignment target according to claim 10 further comprising:
    the skew of the at least one of the plurality of blades is different from a skew of at least one other blade in the plurality of blades.

12. The alignment target according to claim 10 further comprising:
    the skew of the at least one of the plurality of blades being different from a skew of all the other blades in the plurality of blades.

13. The alignment target according to claim 10, wherein:
    each of the plurality of blades having a skew different from the skew of all other blades in the plurality of blades.

14. An alignment target comprising:
    a target characterized by a fan shape;
    the target having a plurality of blades; and
    at least one of the plurality of blades having a non-zero spiral.

15. The alignment target according to claim 14 further comprising:
    the spiral of the at least one of the plurality of blades being different from a spiral of at least one other blade in the plurality of blades.

16. The alignment target according to claim 14 further comprising:
    the spiral of the at least one blade in the plurality of blades being different from the spiral of all other blades in the plurality of blades.

17. The alignment target according to claim 14, wherein:
    each of the plurality of blades having a spiral different from the spiral of all other blades in the plurality of blades.

* * * * *